(12) United States Patent
Lee et al.

(10) Patent No.: US 8,278,178 B2
(45) Date of Patent: Oct. 2, 2012

(54) NONVOLATILE MEMORY DEVICE AND METHOD OF MANUFACTURING THE SAME

(75) Inventors: Hee Youl Lee, Icheon-Si (KR); Jae Yoon Noh, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 118 days.

(21) Appl. No.: 12/562,727

(22) Filed: Sep. 18, 2009

(65) Prior Publication Data

US 2010/0072560 A1    Mar. 25, 2010

(30) Foreign Application Priority Data

Sep. 19, 2008 (KR) .......... 10-2008-0091987
Dec. 24, 2008 (KR) .......... 10-2008-0133107
May 25, 2009 (KR) .......... 10-2009-0045402

(51) Int. Cl.
*H01L 21/336* (2006.01)
*H01L 21/8234* (2006.01)

(52) U.S. Cl. . 438/302; 257/316; 257/393; 257/E21.616; 257/E27.06; 438/300; 438/304

(58) Field of Classification Search .......... 438/152, 438/272, 302; 257/393, E21.616, E21.619, 257/E27.06

See application file for complete search history.

(56) References Cited

U.S. PATENT DOCUMENTS

| 2006/0220098 A1* | 10/2006 | Lee et al. ........ 257/315 |
| 2007/0128812 A1* | 6/2007 | Lee et al. ........ 438/291 |
| 2008/0093648 A1* | 4/2008 | Oh et al. ........ 257/315 |

FOREIGN PATENT DOCUMENTS

| JP | 2000-188378 A | 7/2000 |
| KR | 10-2000-0076892 | 12/2000 |
| KR | 10-2004-0008504 | 1/2004 |
| KR | 10-2007-0000783 | 1/2007 |
| KR | 10-0771518 | 10/2007 |
| KR | 10-2008-0000775 | 1/2008 |
| KR | 10-0816755 | 3/2008 |
| KR | 10-2008-0052020 | 6/2008 |

* cited by examiner

*Primary Examiner* — Mamadou Diallo
(74) *Attorney, Agent, or Firm* — Marshall, Gerstein & Borun LLP

(57) ABSTRACT

A method of manufacturing a nonvolatile memory device wherein first gate lines and second gate lines are formed over a semiconductor substrate. The first gate lines are spaced-from each other at a first width, the second gate lines are spaced-from each other at a second width, and the first width is wider than the second width. A first ion implantation process of forming first junction regions in the semiconductor substrate between the first gate lines and the second gate lines is performed. A second ion implantation process of forming second junction regions in the respective first junction regions between the first gate lines is then performed.

13 Claims, 11 Drawing Sheets

First ion implantation

Second ion implantation

Second dopant implantation

Third dopant implantation

NONVOLATILE MEMORY DEVICE AND METHOD OF MANUFACTURING THE SAME

CROSS-REFERENCE TO RELATED APPLICATIONS

Priority to Korean patent application numbers 10-2008-0091987 filed Sep. 19, 2008, 10-2008-0133107 filed Dec. 24, 2008, and 10-2009-0045402 filed May 25, 2009, the entire respective disclosures of which are incorporated by reference herein, is claimed.

BACKGROUND

Embodiments of the disclosure relate generally to a nonvolatile memory device and a method of manufacturing the same, and, more particularly, to the junction regions of a nonvolatile memory device.

In a nonvolatile memory device, memory cells for storing data are interconnected in series within the same string. The memory cells are electrically interconnected through junction regions within the same string.

FIG. 1 is a sectional view of a known nonvolatile memory device.

The nonvolatile memory device of FIG. 1 may be implanted by forming a number of gate lines on a semiconductor substrate 10 in which well and junction regions 10a and 10b are formed. For example, the gate lines may be classified into various types according to the function or structure. In FIG. 1, word lines WL0 to WL2 and a source select line SSL are shown as examples.

Each of the word lines WL and the source select line SSL may have a stack structure, including a gate insulation layer 12, a floating gate 14, a dielectric layer 16, a control gate 18, and a hard mask pattern 20. Here, the source select line SSL functions to transfer a driving voltage. Thus, a dielectric layer contact hole (ONC) is formed in the dielectric layer 16, thereby electrically connecting the floating gate 14 and the control gate 18. The word lines WL are coupled to the control gates of the memory cells, and the source select line SSL is coupled to the control gate of a source select transistor. For convenience of description, the junction regions formed between the word lines WL0 to WL2 are referred to as first junction regions 10a, and the junction region formed between the source select line SSL and the first word line WL0 is referred to as a second junction region 10b.

The source select line SSL uses voltage higher than voltage used in the first to third word lines WL0 to WL2. Thus, the distance between the source select line SSL and an adjacent first word line WL0 is wider than a distance between the word lines WL0 to WL2. However, there is a limit to an increase of the distance between the source select line SSL and the adjacent first word line WL0 because of the degree of integration of nonvolatile memory devices. Accordingly, the electrical properties of the first word line WL0 of the word lines WL0 to WL2 is more likely to deteriorate than the other word lines.

For example, electrons may be trapped in the gate insulation layer (or a tunnel insulation layer) with the repetition of a program operation and an erase operation. The trapped electrons may cause an increase in the threshold voltage of the memory cell. Furthermore, a memory cell having a larger amount of electrons trapped in the gate insulation layer (or the tunnel insulation layer) has a higher program operation than other memory cell having a smaller amount of electrons trapped in the gate insulation layer (or the tunnel insulation layer). Accordingly, a distribution width of the threshold voltage of a corresponding nonvolatile memory device may increase. In particular, in the first word line WL0, the length of the second junction region 10b is long because the distance between the first word line WL0 and the source select line SSL is wide. Accordingly, the second junction region 10b has a higher capacitance than each of the first junction regions 10a between the word lines WL0 to WL2, which may change a distribution of the threshold voltages. Such the difference in the capacitance has an effect on the erase operation, which is described below with reference to FIG. 2, below.

FIG. 2 is a graph showing variations in the potential energy of the known nonvolatile memory device.

The graph of FIG. 2 shows the difference in the potential energy voltage for every well and junction region when the erase operation of the nonvolatile memory device is performed. The erase operation of a nonvolatile memory device in which P-wells are formed is described as an example. In an erase peripheralod, an erase voltage (e.g., 20 V) is applied to the P-well. Here, the potential energy of not only the P-well, but the second junction region 10b formed between the source select line SSL and the first word line WL0 increases, and the potential energy of the first junction regions 10a formed between the word lines WL0 to WL2 increases. In a discharge peripheralod subsequent to the erase peripheralod, the level of the erase voltage applied to the P-well is lowered. Here, a section A in which the potential energy changes is generated between the erase peripheralod and the discharge peripheralod. A width of the change is narrow because the erase voltage or a discharge voltage is directly applied to the P-well. A width of the change in the junction region between the word lines is slightly wider than that in the P-well.

Meanwhile, a width of the change in the second junction regions 10b between the source select line SSL and the first word line WL0 is wider than that in the junction region between the word lines because it is directly influenced by electrons trapped in the gate insulation layer 12 of the first word line WL0. If the reaction speed of the second junction region 10b is slow that that of other junction regions, many electrons can be generated because the leakage current is likely to occur. In particular, if the P-well is discharged prior to the second junction regions 10b and thus becomes 0 V, the erased floating gate 14 of the first word line WL0 becomes a positive potential state. Here, since the electrons generated in the second junction region 10b can enter the floating gate 14 of the first word line WL0, the cycling characteristic of the nonvolatile memory device may deteriorate.

Further, a nonvolatile memory device includes a number of junction regions. The junction regions are formed by performing an ion implantation process whereby impurity ions are implanted into a semiconductor substrate. The profile of the ion implantation process, such as the type of ions, the concentration of ions, or the implantation depth of ions, varies for every junction region. Accordingly, prior to the ion implantation process, a mask process of opening regions (i.e., targets), but defining regions (which are not targets) must be performed. Consequently, there is a problem in that a process of forming junction regions is complicated because the mask process must be repeatedly performed as many as the number of transistors including different junction regions.

Furthermore, to manufacture a nonvolatile memory device, a large number of unit processes must be performed. The unit processes include a stack process, an etch process, an ion implantation process, etc., and they are typically performed on a wafer basis. From among the unit processes, the ion implantation process is a process technique that is used to allow dopant ions, such as boron (B) and arsenic (As), to pass through the wafer surface by a strong electric field. If the junction regions are formed using this technique, the electrical properties of the transistor can be controlled.

Since transistors having different characteristics are formed on a wafer, the transistors must include different junction regions suitable for the characteristics. Accordingly, a process of forming and removing ion implantation masks for selectively opening the junction regions must be performed several times. However, the process of forming and removing the ion implantation masks causes to increase the process expenses and the turn-around time. Accordingly, efforts to reduce the process of forming the ion implantation masks are continuing.

BRIEF SUMMARY

According to one or more embodiments, deterioration of the electrical properties of junction regions can be prohibited, and a process of forming the junction regions can be simplified.

A method of manufacturing a nonvolatile memory device according to a first aspect of this disclosure comprises forming first gate lines and second gate lines over a semiconductor substrate of a cell region, wherein the first gate lines are spaced from each other at a first width, the second gate lines are spaced from each other at a second width; performing a first ion implantation process to form first junction regions in the semiconductor substrate between the first gate lines, between the first gate line and the second gate line, and between the second gate lines; and performing a second ion implantation process to form second junction regions in first junction region of the semiconductor substrate between the first gate lines and between the second gate line and the first gate line.

The second ion implantation process is a tilt ion implantation process.

The second ion implantation process is not performed in the first junction regions formed between the second gate lines.

The first ion implantation process is performed by implanting impurities in a direction vertical to the semiconductor substrate.

An impurity concentration of the second ion implantation process is lower than that of the first ion implantation process.

The second ion implantation process comprises forming a mask pattern exposing the first junction regions formed between the first gate lines and between the second gate line and the first gate line; and performing the second ion implantation process to form the second junction regions in the exposed first junction regions.

The second ion implantation process comprises forming spacers on sidewalls of the first gate lines and on a sidewall of the second gate line formed adjacent to the first gate lines with covering the first junction regions formed between the second gate lines; and performing the second implantation process to form the second junction regions between the first gate lines and between the second gate line and the first gate line.

The first gate lines comprise select lines and the second gate lines comprise word lines.

The first width is wider than that of the second width.

A third width between the first gate line and the second gate line is wider than the second width.

The spacer comprises an oxide layer or nitride layer.

A method of manufacturing a nonvolatile memory device according to a second aspect of this disclosure comprises providing a semiconductor substrate defining a cell region and a peripheral region; forming select transistors and a plurality of memory cells over the semiconductor substrate of the cell region, and forming low-voltage NMOS transistors or high-voltage NMOS transistors over the semiconductor substrate of the peripheral region; forming first junction regions in the semiconductor substrate between the select transistors, between memory cell and the select transistor, and between plurality of the memory cells and between the low-voltage NMOS transistors, and between the high-voltage NMOS transistors; forming spacers on sidewalls of the select transistors and on a sidewall of memory cell formed adjacent to the select transistors with covering the first junction regions formed between the plurality of memory cells and on sidewalls of the low-voltage NMOS transistors and on sidewalls of the high-voltage NMOS transistors; forming second junction regions in the first junction regions of the peripheral region by performing a tilt ion implantation process using the spacers as an ion implantation mask.

A width between the select transistors and the memory cell formed adjacent to the select transistors is narrower than that between the low-voltage NMOS transistors or the high-voltage NMOS transistors.

The spacer comprises oxide layer or nitride layer.

A method of manufacturing a nonvolatile memory device according to a third aspect of this disclosure comprises forming first gate patterns over a semiconductor substrate of a cell region and forming second gate patterns and third gate patterns over the semiconductor substrate of a peripheral region; forming junction region in the semiconductor substrate on both sides of each of the first gate patterns; and forming peripheral junction regions in the semiconductor substrate on both sides of each of the second gate patterns including lower portions of the third gate patterns.

The third gate patterns are formed between the third gate patterns

A width of the second gate patterns is narrower than that of the second gate patterns.

A width of the third gate patterns is narrower than that of the second gate patterns.

The first gate patterns comprise a source select transistor, a drain select transistor, and a plurality of memory cells.

The second gate patterns comprise first driving transistor gates formed in a first peripheral region of the semiconductor substrate and second driving transistor gates formed in a second peripheral region of the semiconductor substrate; and the third gate patterns comprise first barrier dummy patterns formed on both sides of the first driving transistor gates in the first peripheral region and second barrier dummy patterns formed on both sides of the second driving transistor gates in the second peripheral region.

The first peripheral junction regions formed of a P-type and the second peripheral junction regions formed of an N-type.

A first width between the first driving transistor gates and the first barrier dummy patterns is narrower than a second width between the second driving transistor gates and the second barrier dummy patterns.

The formation of the peripheral junction region comprises implanting P-type impurity ions into the first and second peripheral regions and the cell region; implanting N-type impurity ions into the second peripheral region and the cell array region so that the P-type impurity ions implanted into the second peripheral region and the cell region are offset from each other; and implanting the N-type impurity ions into the second peripheral region so that the implantation of the N-type impurity ions into the first peripheral region and the cell array region is blocked.

The implantation of the P-type impurity ion is performed at an angle of arctangent (h/I1) to 90°.

The implantation of the N-type impurity ions so that the P-type impurity ions implanted into the second peripheral region and the cell region is offset is performed at an angle of more than arctangent (h/I3) to less than arctangent (h/I1).

The method of claim 31, wherein the implantation of the N-type impurity ions into the second peripheral region so that the implantation of the N-type impurity ions into the first peripheral region and the cell region is blocked is performed at an angle of more than arctangent (h/I2) to less than arctangent (h/I4).

The formation of the junction regions is performed by implanting the N-type impurity ions into the cell array region at an angle of more than arctangent (h/I3) to less than arctangent (h/I1).

A nonvolatile memory device according to an aspect of this disclosure comprises first gate patterns formed over a semiconductor substrate of a cell region and second gate patterns and third gate patterns formed over the semiconductor substrate of the peripheral region; cell junction regions formed in the semiconductor substrate on both sides of each of the first gate patterns; and peripheral junction regions formed in the semiconductor substrate on both sides of each of the second gate patterns including lower portions of the third gate patterns.

The second gate patterns are formed between the third gate patterns.

A width of the third gate patterns is narrower than that of the first gate patterns.

A width of the third gate patterns is narrower than that of the second gate patterns.

The first gate patterns comprise a source select transistor, a drain select transistor, and a plurality of memory cells.

The second gate patterns comprise first driving transistor gates formed in a first peripheral region of the semiconductor substrate and second driving transistor gates formed in a second peripheral region of the semiconductor substrate; and the third gate patterns comprise first barrier dummy patterns formed on both sides of the first driving transistor gate in the first peripheral region and second barrier dummy patterns formed on both sides of the second driving transistors in the second peripheral region.

The first peripheral junction regions formed of a P-type and the second peripheral junction regions formed of an N-type.

A first width between the first driving transistor gates and the first barrier dummy patterns is narrower than a second width between the second driving transistor gates and the second barrier dummy patterns.

DESCRIPTION OF EMBODIMENTS

Figure 1:
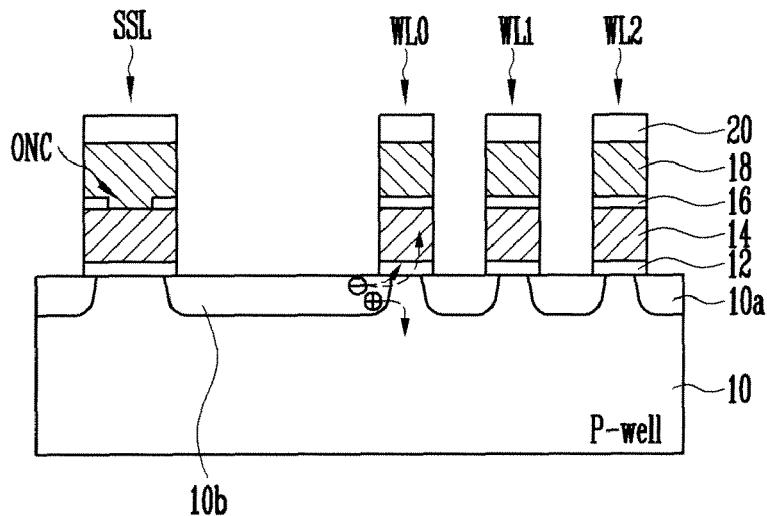
FIG. 1 is a sectional view of a known nonvolatile memory device.
Figure 2:
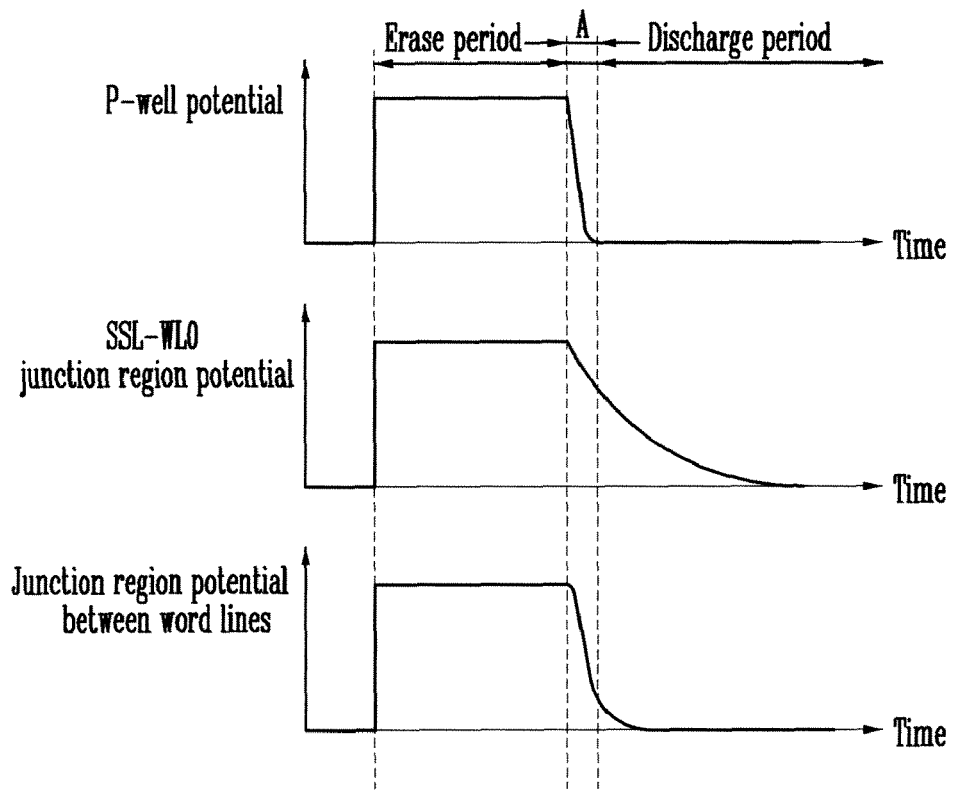
FIG. 2 is a graph showing variations in the potential energy of the known nonvolatile memory device.

Hereinafter, the present disclosure will be described in detail in connection with some embodiments with reference to the accompanying drawings. The drawing figures are provided to allow those having ordinary skill in the art to understand the scope of the embodiment of the disclosure.

Figure 3A:
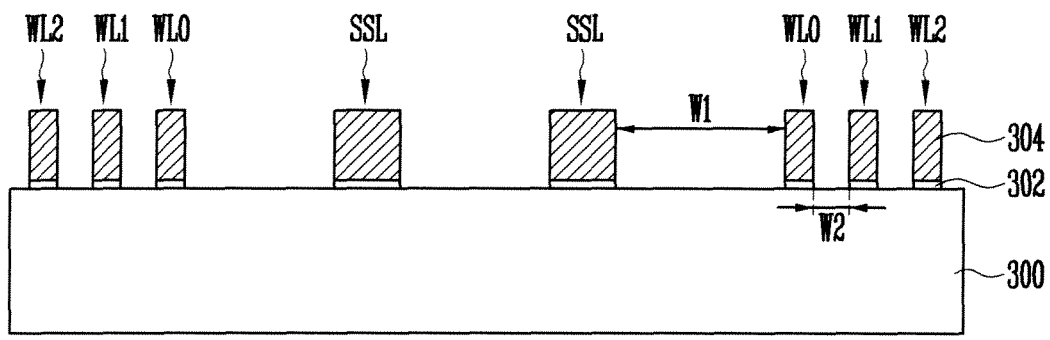
FIGS. 3A to 3C are sectional views illustrating a method of forming junction regions of a nonvolatile memory device according to a first embodiment.
Figure 3B:
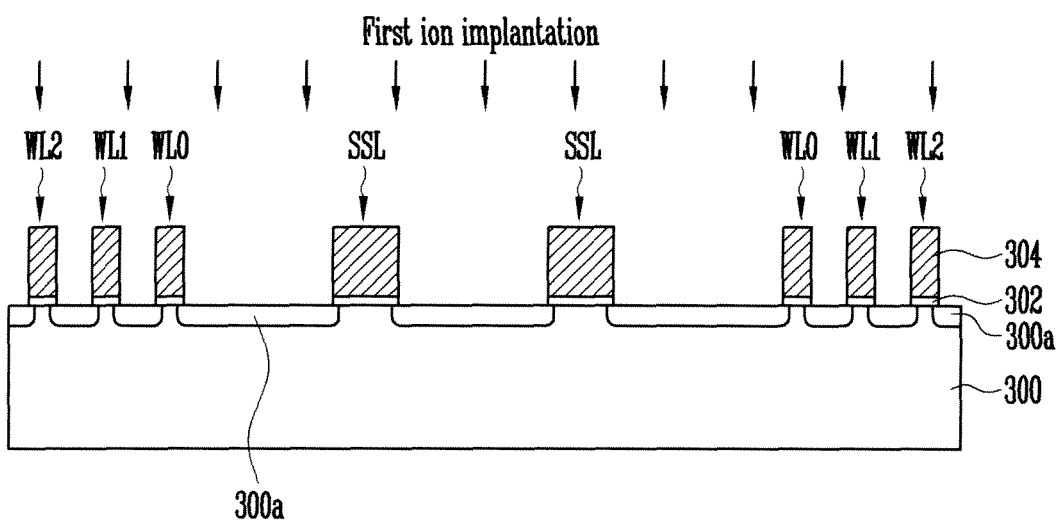
Figure 3C:
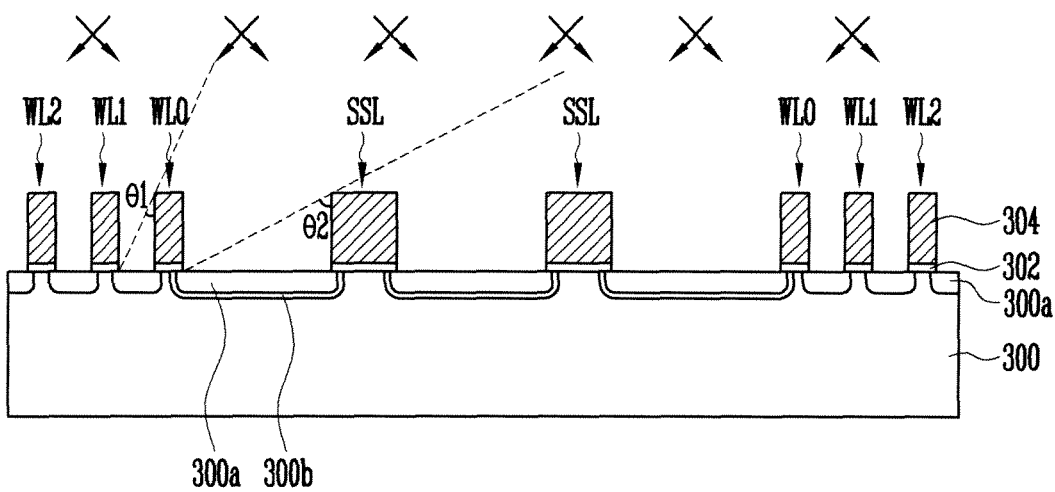

FIGS. 3A to 3C are sectional views illustrating a method of forming the junction regions of a nonvolatile memory device according to a first embodiment.

Referring to FIG. 3A, there is provided a semiconductor substrate 300 in which a well is formed. The well may be of an N-type or a P-type. A case where a P-type well is formed is described as an example. Gate lines 304 are formed over the semiconductor substrate 300 having the P-type well formed therein. The gate lines 304 include source select lines SSL and first to third word lines WL0 to WL2. Each of the source select lines SSL has a basic structure in which a gate insulation layer 302 and a gate are stacked. Each of the first to third word lines WL0 to WL2 has a basic structure in which the gate insulation layer 302, a floating gate, a dielectric layer, and a control gate are stacked. Since the source select line SSL transfers voltage higher than that of the first to third word lines WL0 to WL2, a first width W1 between the source select line SSL and the first word line WL0 preferably is wider than a second width W2 between the first to third word lines WL0 to WL2.

Meanwhile, first gate lines are defined as the gate lines 304, which are spaced from each other at a first width W1. In the drawings, the first gate lines correspond to the source select lines SSL and the first word lines WL0 adjacent to the source select lines SSL, from among the gate lines 304. Second gate lines are defined as the gate lines 304 which are spaced from each other at a second width W2. In the drawings, the second gate lines correspond to the first to third word lines WL0 to WL2.

Referring to FIG. 3B, to electrically couple the first to third word lines WL0 to WL2 and the source select lines SSL, first junction regions 300a are formed in the semiconductor substrate 300 exposed between the gate lines 304. A first ion implantation process preferably is performed in such a manner that the incident angle of the impurities is vertical to the semiconductor substrate 300 to uniformly form the first junction regions 300a in the semiconductor substrate 300 exposed between the gate lines 304. The first junction regions 300a are formed between the source select lines SSL, between the source select lines SSL and the first word lines WL0, and between adjacent pairs of the first to third word lines WL0 to WL2. The length of the first junction regions 300a formed between the first to third word lines WL0 to WL2 is longer than the length of the first junction regions 300a formed between the source select lines SSL and between the source select lines SSL and the first word lines WL0.

Referring to FIG. 3C, to improve the electrical properties of the first junction regions 300a formed between the source select lines SSL and between the source select line SSL and the first word line WL0, second junction regions 300b are formed therebetween using a second ion implantation process.

The second ion implantation process preferably is performed using an impurity concentration (e.g., $10^{11}$ ions/cm³ to $10^{13}$ ions/cm³) lower than the impurity concentration of the first ion implantation process. Arsenic (As) or phosphorus (P), for example, may be used as the impurity.

In particular, to uniformly form the second junction regions 300b at the corner regions of the source select lines SSL, from among both corner regions of each of the source select lines SSL and both corner regions of the first word line WL0, the second ion implantation process preferably is performed using a tilt ion implantation process. The tilt ion implantation process is performed using impurities at a tilted incident angle. Preferably, the incident angle may be equal to or smaller than an angle θ2 which ranges from the top corner of the source select line SSL to the bottom corner of the first word line WL0. In particular, the second ion implantation process preferably is performed twice, left and right, to uniformly form the second junction region 300b across both ends of a region where the second junction region 300b will be formed.

It is preferred that the second junction region 300b not be formed in the first junction region 300a formed between the first to third word lines WL0 to WL2. To this end, an incident angle of the second ion implantation process is greater than an angle θ1 from the top corner of one word line to the bottom corner of another word line adjacent to the one word line. The range of the incident angle of the impurities may be expressed in the following equation; θ1<incident angle<θ2. Accordingly, the second junction regions 300b including the first junction regions 300a, respectively, can be formed between the source select lines SSL and between the source select line SSL and the first word line WL0.

Figure 4:
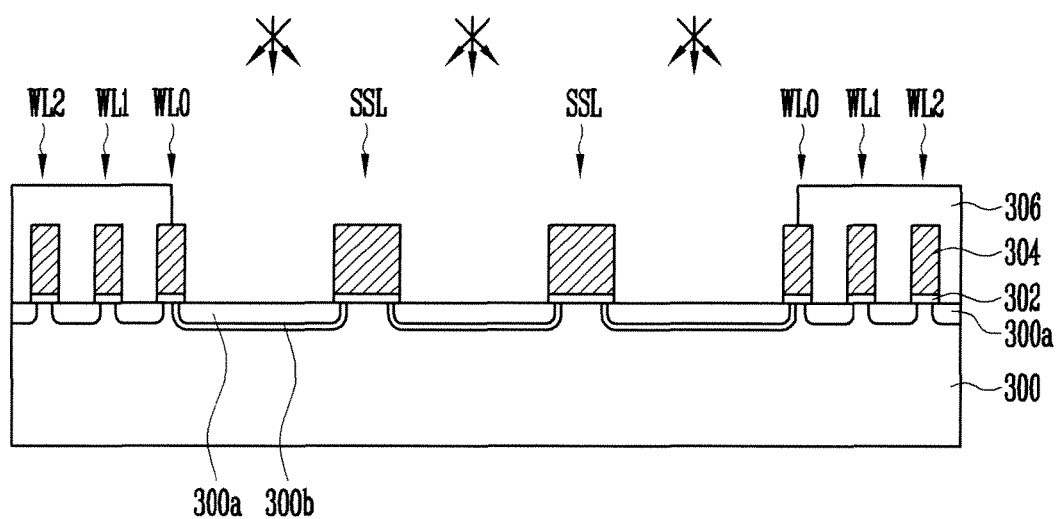
FIG. 4 is a sectional view illustrating a method of forming junction regions of a nonvolatile memory device according to a second embodiment.

FIG. 4 is a sectional view illustrating a method of forming the junction regions of a nonvolatile memory device according to a second embodiment.

Referring to FIG. 4, according to the description of FIGS. 3A and 3B, the first to third word lines WL0 to WL2 and the source select lines SSL are formed on the semiconductor substrate 300, and the first junction regions 300a are formed in the semiconductor substrate 300 exposed between the gate lines 304. Next, to protect the first junction regions 300a formed between the first to third word lines WL0 to WL2, a mask pattern 306 is formed on the first to third word lines WL0 to WL2 and on the first junction regions 300a between the first to third word lines WL0 to WL2. That is, the mask pattern 306 is opened at portions where the second junction regions 300b will be formed. The mask pattern 306 may be formed of a hard mask layer, but preferably may be formed of a photoresist layer.

After the mask pattern 306 is formed, the second junction regions 300b are formed in the semiconductor substrate 300 between the source select lines SSL and between the source select line SSL and the first word line WL0 by performing a third ion implantation process. Here, since the first junction regions 300a between the first to third word lines WL0 to WL2 are covered with the mask pattern 306, the third ion implantation process preferably is performed at an angle smaller than the angle 1, which ranges from the top corner of one word line to the bottom corner of the other word line adjacent to the one word line, as compared with the second ion implantation process of the first embodiment. The remaining process conditions of the third ion implantation process are identical to those of the second ion implantation process.

Figure 5:
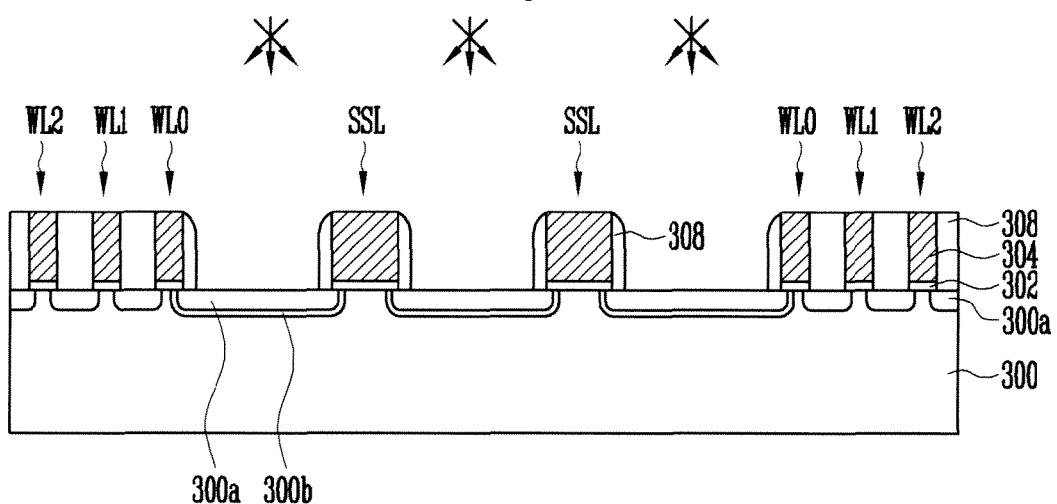
FIG. 5 is a sectional view illustrating a method of forming junction regions of a nonvolatile memory device according to third embodiment.

FIG. 5 is a sectional view illustrating a method of forming the junction regions of a nonvolatile memory device according to third embodiment.

According to the description of FIGS. 3A and 3B, the first to third word lines WL0 to WL2 and the source select lines SSL are formed on the semiconductor substrate 300, and the first junction regions 300a are formed in the semiconductor substrate 300 exposed between the gate lines 304.

A spacer 308 is formed on the sidewalls of the source select lines SSL and the first to third word lines WL0 to WL2. The spacer 308 may be formed of an oxide layer. Here, when an etch process of forming a pattern for the spacer 308 is performed, the spacer 308 between the first to third word lines WL0 to WL2 remains without being etched because the distance between the first to third word lines WL0 to WL2 is narrow. Accordingly, the first junction regions 300a between the first to third word lines WL0 to WL2 are not exposed.

Next, when a fourth ion implantation process is performed, the second junction regions 300b can be formed between the source select lines SSL and between the source select line SSL and the first word line WL0 because the spacer 308 protects the first junction regions 300a between the first to third word lines WL0 to WL2. Here, since the first junction regions 300a between the first to third word lines WL0 to WL2 are covered with the spacer 308, the fourth ion implantation process may be performed at an angle smaller than the angle θ1 which ranges from the top corner of one word line to the bottom corner of the other word line adjacent to the one word line, as compared with the second ion implantation process of the first embodiment. The remaining process conditions of the fourth ion implantation process are identical to those of the second ion implantation process.

Figure 6A:
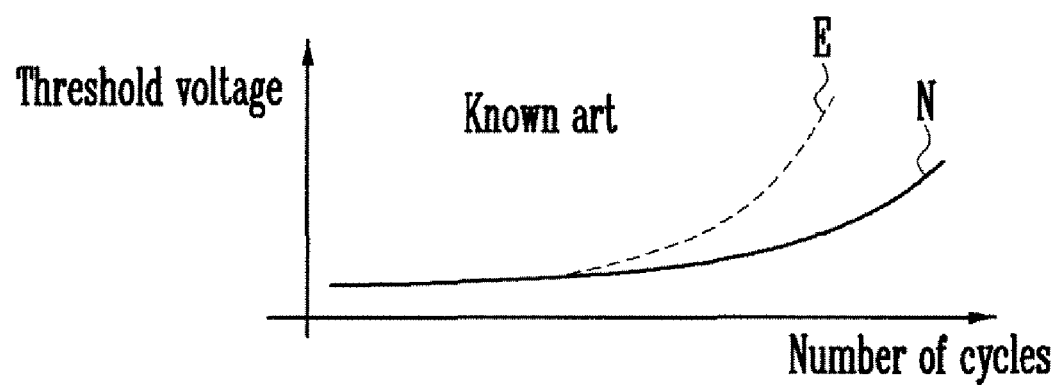
FIG. 6A is a graph showing variation in the threshold voltage of the known nonvolatile memory device of FIG. 1.
Figure 6B:
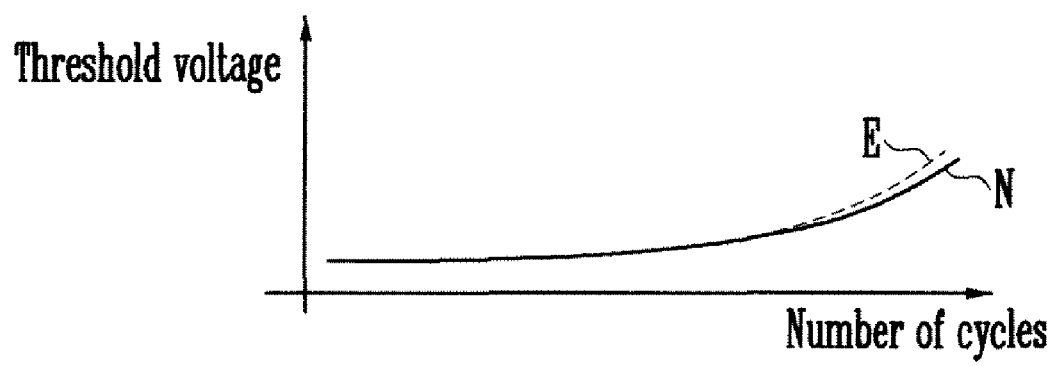
FIG. 6B is a graph showing variation in the threshold voltage of the nonvolatile memory device according to the first to third embodiments.

FIG. 6A is a graph showing variation in the threshold voltage of the known nonvolatile memory device of FIG. 1, and FIG. 6B is a graph showing variation in the threshold voltage of the nonvolatile memory device according to the first to third embodiments.

From FIG. 6A, it can be seen that, in the known memory device, the amount of electrons trapped in the gate insulation layer increases as the number of program and erase cycles increases with the repetitive operation of the nonvolatile memory device. Accordingly, the threshold voltage increases. In particular, an increment of the threshold voltage of a word line E (e.g., the first word line (WL0 of FIG. 4)) placed at the edge of the string has a sharp slope as compared with an increment of other word lines N formed on the inside of the string.

Referring to FIG. 6B, although, in one or more embodiments, a region where the source select lines SSL are formed is described as an example, the one or more embodiments may also be applied to a region where drain select lines are formed. According to the above technique, although the number of program and erase cycles increases, the difference in the threshold voltage between the word lines E or N can be reduced. Accordingly, the electrical properties of a nonvolatile memory device can be prevented from deteriorating and, therefore, reliability of the nonvolatile memory device can be improved.

FIGS. 7A to 7E and FIGS. 8A to 8D are sectional views illustrating a method of forming the junction regions of a nonvolatile memory device according to a fourth embodiment. FIGS. 7A to 7E show the peripheral regions of the nonvolatile memory device, and FIGS. 8A to 8D show the cell array regions of the nonvolatile memory device.

Figure 7A:
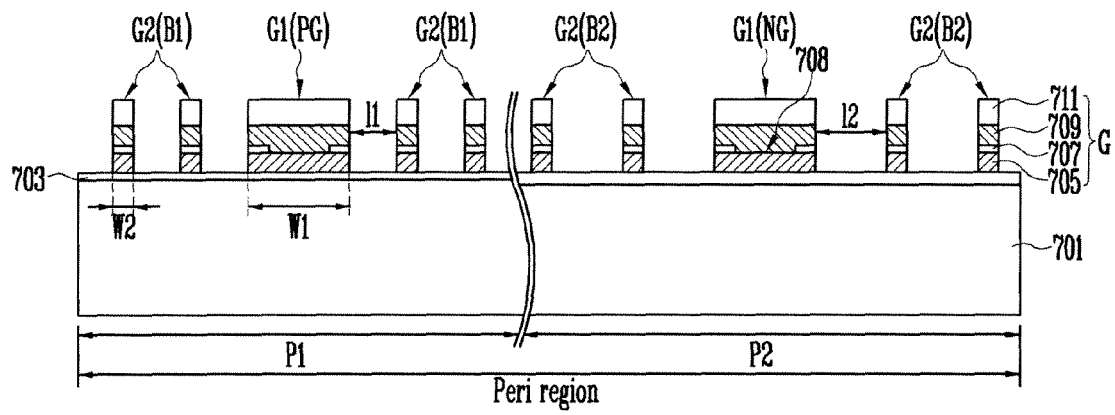
FIGS. 7A to 7E and FIGS. 8A to 8D are sectional views illustrating a method of forming the junction regions of a nonvolatile memory device according to a fourth embodiment.
Figure 8A:
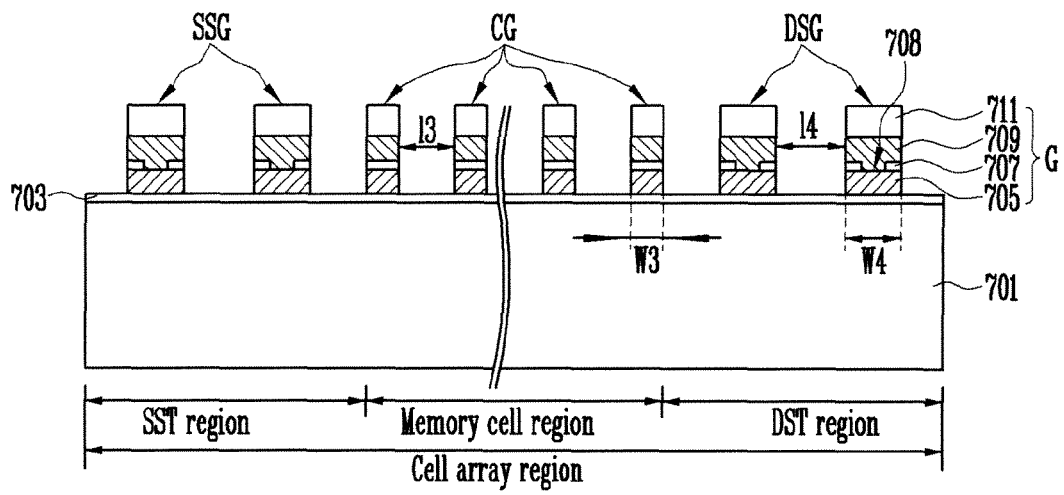

Referring to FIGS. 7A and 8A, gate patterns G are formed over a semiconductor substrate 701. The gate patterns G are formed with a gate insulation layer 703 interposed therebetween. Furthermore, each of the gate patterns G may have the stack structure of a first conductive layer 705, a dielectric layer 707, and a second conductive layer 709. A gate hard mask pattern 711 may be further stacked on the second conductive layer 709.

An example of a method of forming the gate patterns G is described in detail below.

First, the gate insulation layer 703 and the first conductive layer 705 are stacked over the semiconductor substrate 701. An isolation hard mask pattern (not shown) is formed on the first conductive layer 705. Next, the first conductive layer 705, the gate insulation layer 703, and the semiconductor substrate 701 are etched by an etch process using the isolation hard mask pattern as an etch barrier. Thus, a number of trenches (not shown) are formed in the semiconductor substrate 701. The active regions of the semiconductor substrate 701 are defined through the formation of the trenches. Thus, regions of the semiconductor substrate 701 other than the portions where the trenches are formed become the active regions. Furthermore, the first conductive layer 705 and the gate insulation layer 703 remain on only on the active regions. After the trenches are formed, an insulating material is formed to a sufficient thickness on the semiconductor substrate 701, including the trenches, so that the insides of the trenches are gap-filled with the insulating material. The surface of the insulating material is then polished. Isolation layers (not shown) are formed in the semiconductor substrate 701 through a series of the above processes. The isolation hard mask pattern may be removed after the isolation layers are formed.

The gate insulation layer 703 preferably is made of silicon oxide ($SiO_2$). In this case, the gate insulation layer 703 may be formed by a wet oxidation process or a dry oxidation process. The first conductive layers 705 are used as the floating gates of the nonvolatile memory device and preferably are made of polysilicon.

After the isolation layers are formed, the dielectric layer 707 is formed over the semiconductor substrate 701. The dielectric layer 707 preferably has a stack structure of an oxide layer, a nitride layer, and an oxide layer. Further, the dielectric layer 707 preferably is made of $Al_2O_3$ having a high dielectric constant with the higher degree of integration of nonvolatile memory devices. The dielectric layer 707 includes a contact hole 708 through which the first conductive layer 705 is exposed in a region where the gate of a driving transistor will be formed. The first conductive layer 705 and the second conductive layer 709 can be electrically interconnected through the contact hole 708.

The second conductive layer 709 and the gate hard mask pattern 711 are stacked over the dielectric layer 707 including the contact holes 708. Next, the second conductive layer 709, the dielectric layer 707, and the first conductive layer 705 are etched by an etch process using the gate hard mask pattern 711 as an etch barrier. Accordingly, the gate patterns G in each of which the first conductive layer 705, the dielectric layer 707, and the second conductive layer 709 are stacked over the gate insulation layer 703 formed on the semiconductor substrate 701.

The gate hard mask pattern 711 preferably is formed using a photoresist pattern as an etch barrier. Furthermore, to form the gate hard mask pattern 711 having a width narrower than the limit of exposure resolution, a spacer patterning method can be used when forming the gate hard mask pattern 711. The spacer patterning method preferably is performed by forming a spacer on the sidewalls of an auxiliary mask pattern using the photoresist pattern, removing the auxiliary mask pattern and the photoresist pattern, and patterning the gate hard mask pattern 711 using the spacer as an etch barrier.

The second conductive layer 709 is a conductive layer for a control gate. The second conductive layer 709 may have a single layer structure of a polysilicon layer or may have a stack structure of two or more layers in which an auxiliary layer is stacked over a polysilicon layer to improve the resistance of the polysilicon layer. The auxiliary layer preferably is made of tungsten suicide ($WSi_x$) or tungsten (W).

The gate patterns G are formed in a peripheral region (refer to FIG. 7) and a cell array region (refer to FIG. 8) through the above-described processes. Here, the peripheral region includes a number of driving transistors constituting a circuit for applying a driving signal to the memory cells of the nonvolatile memory device. Further, the cell array region includes a number of memory cell blocks for storing data. A number of string structures are formed in each of the memory cell block. Each of the string structures includes a number of memory cells which are in series coupled between a source select transistor and a drain select transistor.

Each of the gate patterns G formed in the peripheral region (hereinafter referred to as 'first gate patterns') includes a first pattern G1 and second patterns G2 formed on both sides of the first pattern G1. The first pattern G1 is the gate of the driving transistor that will be formed in the peripheral region. The second pattern G2 functions as a barrier in an ion implantation process of forming peripheral junction regions in a subsequent process, and it is a dummy pattern that is not involved in the operation of the nonvolatile memory device.

The gate patterns G formed in the cell array region (hereinafter referred to as 'second gate patterns') include drain select gates (hereinafter referred to as 'DSGs'), source select gates (hereinafter referred to as 'SSGs'), and a number of cell gates (hereinafter referred to as 'CGs') formed between the DSGs and the SSGs. The DSGs are formed in a drain select transistor region (hereinafter referred to as a 'DST region'), the SSGs are formed in a source select transistor region (hereinafter referred to as a 'SST region'), and the CGs are formed in a memory cell region. The first conductive layer 705 and the second conductive layer 709 formed in the DST region and the SST region preferably are electrically interconnected through the contact hole 108 formed in the dielectric layer 707.

A width W2 of the second pattern G2 preferably is formed so that a dopant implanted into the peripheral region in a subsequent ion implantation process easily diffuses under the second pattern G2 and therefore the junction regions are interconnected under the second pattern G2. To this end, the width W2 of the second pattern G2 preferably is narrower than a width W1 of the first pattern G1 and is also narrower than a width W3 or W4 of the second gate pattern.

Meanwhile, the distance between the second gate patterns preferably is narrower than the distance between the first gate patterns. The distance between the first gate patterns and the distance between the second gate patterns are described in more detail below.

The peripheral region is divided into a first peripheral region P1 and a second peripheral region P2, in each of which driving transistors with different electrical properties will be formed. For example, the first peripheral region P1 may be a PMOS region in which PMOS transistors are formed, and the second peripheral region P2 may be an NMOS region in which NMOS transistors are formed.

The peripheral junction regions formed in the first peripheral region P1 and the second peripheral region P2 may have different concentrations, different depths, or different kinds of ions. For reference, in the case where the NMOS transistor formed in the second peripheral region P2 is driven with voltage higher than voltage of the PMOS transistor formed in the first peripheral region P1, the gate insulation layer 703 formed in the second peripheral region P2 preferably is formed thicker than the gate insulation layer 703 formed in the first peripheral region P1.

The first patterns G1 are classified into a first driving gate PG formed in the first peripheral region P1 and a second driving gate NG formed in the second peripheral region P2. Further, the second patterns G2 include first barrier dummy patterns B1 formed in the first peripheral region P1 and second barrier dummy patterns B2 formed in the second peripheral region P2. The first barrier dummy patterns B1 are formed on both sides of the first driving gate PG, and the second barrier dummy patterns B2 are formed on both sides of the second driving gate NG.

In the first peripheral region P1, the gate patterns PG and B1 are formed at a first width I1. In the second peripheral region P2, the gate patterns NG and B2 are formed at a second width I2 which is different from the first width I1. Further, in the cell array region, a fourth distance I4 between the SSGs or the DSGs is wider than a third distance I3 between the CGs. This is for the purpose of securing process margin so that, in a subsequent process, a contact plug can be formed between the SSGs or between the DSGs. The third distance I3 and the fourth distance I4 are different from the first or second width I1 or I2.

The reason why the first width I1, the second width I2, the third distance I3, and the fourth distance I4 are formed differently is to simplify the process of forming the junction regions when forming the junction regions by implanting a dopant in a subsequent ion implantation process. This is described later with reference to FIG. 7B, etc.

Meanwhile, a PMOS is more sensitive than an NMOS to a dopant which is implanted in a subsequent ion implantation process. Thus, it is preferred that, when implanting the dopant using a region (the second peripheral region P2, the cell array region) other than the first peripheral region P1 as a target after implanting the dopant using the first peripheral region P1 as a target, the dopant be not further implanted into the first peripheral region P1. To this end, the first width I1 preferably is narrower than the second width I2 or the third distance I3. This is described in detail later with reference to FIG. 1b, etc.

Furthermore, the second width I2 may be wider than the fourth distance I4.

Furthermore, the aspect ratio formed by each of the first width I1, the second width I2, the third distance I3, and the fourth distance I4 and the height of the gate patterns G preferably is 5.5 or less to secure gap-fill margin in a subsequent process.

Figure 7B:
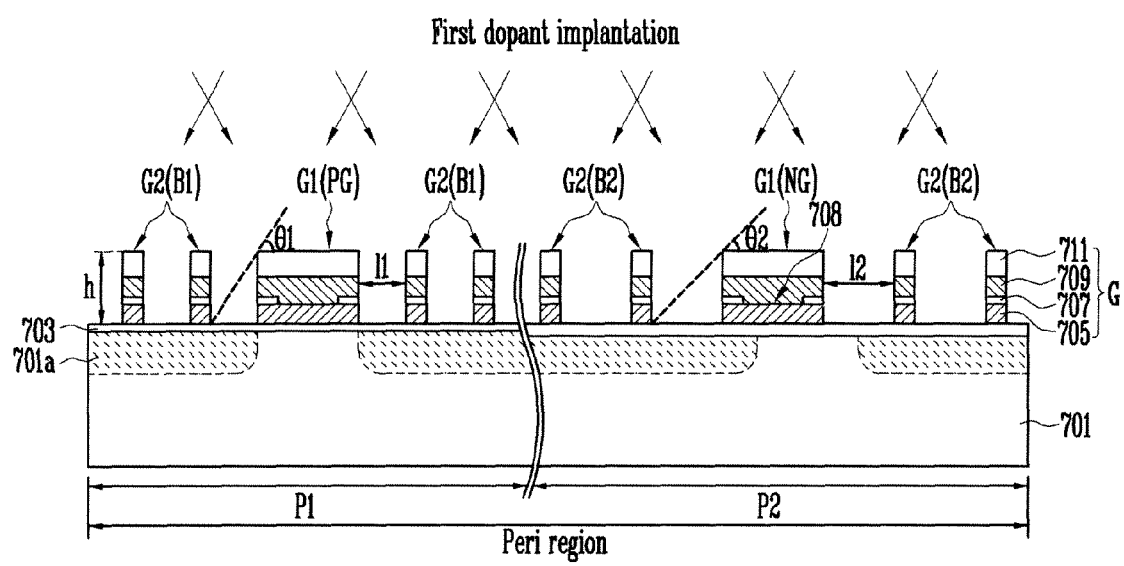
Figure 8B:
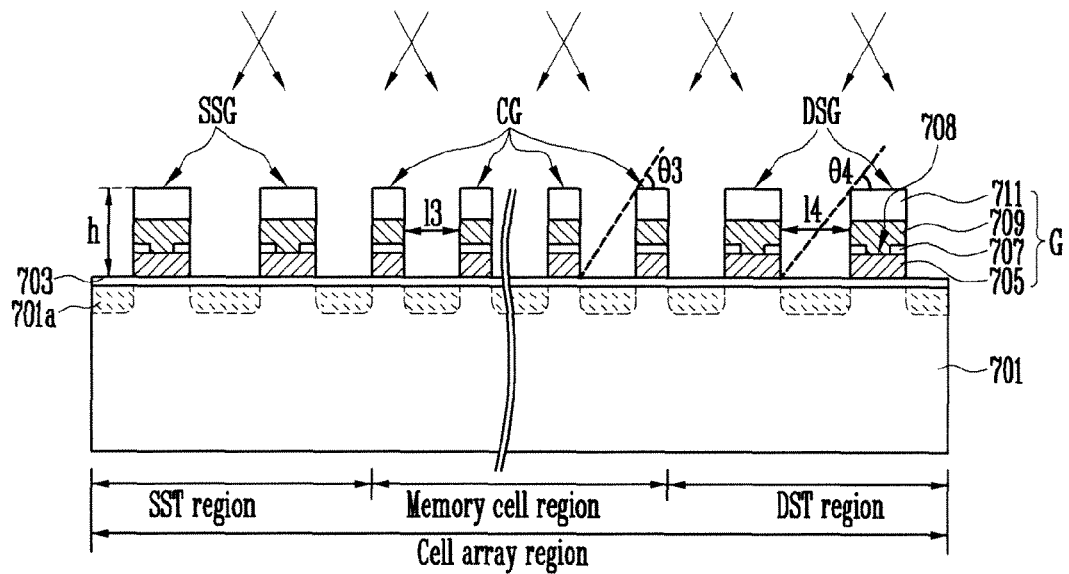

Referring to FIGS. 7B and 8B, first peripheral junction regions 701*a* are formed in the first peripheral region P1 by performing the first ion implantation process of implanting a first dopant at a first angle θ1 to 90° using the first peripheral region P1 as a target. In the case where, when the first ion implantation process is performed, the first dopant is implanted at a tilt angle for the semiconductor substrate 101, the first dopant is implanted at symmetrical angles so that the first peripheral junction regions 701*a* (i.e., a P-type) are uniformly formed on both sides of the first driving gate PG.

If the first width I1 between the first driving gate PG and the first barrier dummy patterns B1 is identical to a height 'h' of the gate patterns G, the first angle θ1 becomes arctangent (h/I1). Thus, at the first angle θ1 to 90° for the semiconductor substrate, the semiconductor substrate 701 between the gate patterns PG and B1 formed in the first peripheral region P1 is opened without being covered by the gate patterns PG and B1 formed in the first peripheral region P1. Accordingly, if the first dopant is implanted into the semiconductor substrate 701 at the first angle θ1 to 90°, the first dopant is implanted into the semiconductor substrate 701 between the gate patterns PG and B1 formed in the first peripheral region P1, thereby forming the first peripheral regions 701*a*. The first peripheral junction regions 701*a* may be formed by implanting the first dopant including a P-type impurity, such as $BF_2$.

Meanwhile, if the second driving gate NG and the second barrier dummy patterns B2 are formed to have the second width I2 and the gate patterns G are formed to have the height 'h', a second angle θ2 becomes arctangent (h/I2). Here, since the first width I1 is narrower than the second width I2, the first angle θ1 is greater than the second angle θ2. Thus, if the first dopant is implanted at the first angle θ1 to 90° which is greater than the second angle θ2, the first dopant is also implanted into the semiconductor substrate 701 between the gate patterns NG and B2 formed in the second peripheral region P2.

Furthermore, if the CGs are formed to have the third width I3, the SSGs and the DSGs are formed to have the fourth distance I4, and the gate patterns G are formed to have the height 'h', a third angle θ3 becomes arctangent (h/I3) and a fourth angle θ4 becomes arctangent (h/I4). Here, the first width I1 is narrower than the third or fourth distance I3 or I4, and the third distance I3 is narrower than the fourth distance I4 (i.e., I1<I3<I4). Accordingly, the first angle θ1 is greater than the third angle θ3 or the fourth angle θ4, and the third angle θ3 is greater than the fourth angle θ4 (i.e., θ1>θ3>θ4). Accordingly, if the first dopant is implanted at the first angle θ1 to 90° greater than the third or fourth angle θ3 or θ4, the first dopant is also implanted into the semiconductor substrate 701 of the cell array region.

The first dopant implanted into the first and second peripheral regions P1 and P2 through the first ion implantation process diffuses under the second patterns G2 (i.e., the first and second barrier dummy patterns B1 and B2) through an additional thermal process or heat generated when a subsequent process is performed. That is, the first peripheral junction regions 701*a* may be interconnected under the second patterns G2 by the diffusion of the first dopant. Meanwhile, the first peripheral junction regions 701*a* formed by the diffusion of the first dopant preferably are formed on both sides of the first pattern G1 so that they are spaced from each other with a channel region under the first pattern G1 (i.e., the first or second driving gate PG or NG) interposed therebetween. Furthermore, the first peripheral junction regions 701*a* formed by the diffusion of the first dopant preferably are formed on both sides of the CG, on both sides of the DSG, and on both sides of the SSG so that they are spaced from each other with a channel region under the CG, a channel region under the DSG, and a channel region under the SSG, respectively, interposed therebetween. The reason why, as described above, the first peripheral junction regions 101*a* can be formed under the CG, under the DSG, under the SSG, and under the first pattern G1 so that they are spaced from each other and can be formed under the second pattern G2 so that they are coupled to each other is that the second pattern G2 has a width narrower than that of the first pattern G1, the CG, the DSG, or the SSG.

Figure 7C:
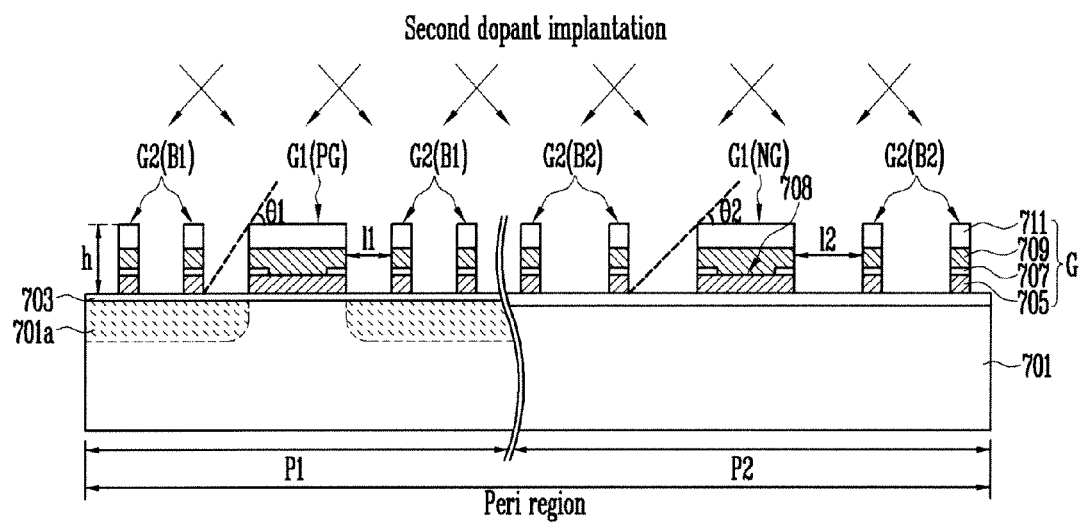
Figure 8C:
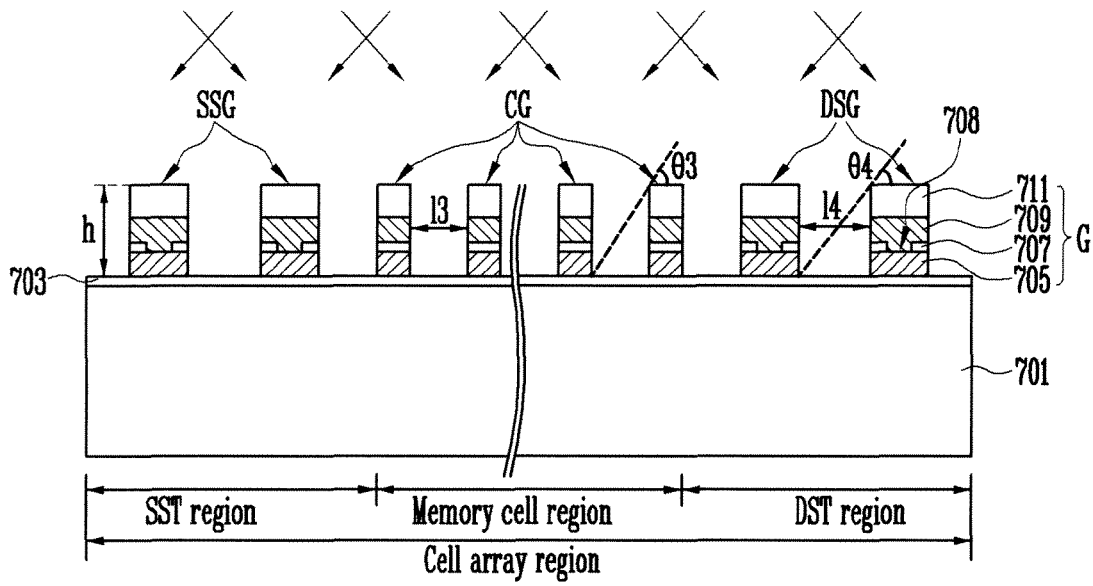

Referring to FIGS. 7C and 8C, to block a second dopant from being implanted into the first peripheral region P1 and to use the second peripheral region P2 and the cell array region as targets, the second ion implantation process of implanting the second dopant at a tilt angle of more than the third angle θ3 to less than the first angle θ1 is performed. The first peripheral junction regions (refer to 701*a* of FIG. 7B) formed in the second peripheral region P2 and the first peripheral junction regions (refer to 701a of FIG. 8B) formed in the cell array region are removed by the second ion implantation process. When the second ion implantation process is performed at a tilt angle, the second dopant is implanted into the semiconductor substrate 701 at symmetrical angles to uniformly remove the first peripheral junction regions (refer to 701a of FIG. 7B) formed on both sides of the second driving gate NG and the first peripheral junction regions (refer to 701a of FIG. 8B) formed on both sides of each of the CG, the SSG, and the DSG of the cell array region.

The second dopant is an impurity ion having a characteristic that is opposite to a characteristic of the first dopant so that the role of the first dopant can be offset. When considering that the first dopant is a P-type impurity, the second dopant preferably is an N-type impurity, such as phosphorus (P) or arsenic (As). The second dopant can be implanted at the same depth and the same dose as the first dopant so that the first peripheral junction regions (refer to 701a of FIGS. 7B and 8B) formed in the second peripheral region P2 and the cell array region can be removed.

As described above with reference to FIGS. 7B and 8B, the third angle θ3 is smaller than the first angle θ1 and greater than the second angle θ2 or the fourth angle θ4. If the second dopant is implanted at an angle greater than the second angle θ2 or the fourth angle θ4 as described above, the second dopant is implanted into the semiconductor substrate 701 between not only the gate patterns NG and B2 formed in the second peripheral region P2, but also between the SSGs, between the SSG and the CG, between the DSG and the CG, and between the CGs. Meanwhile, if the second dopant is implanted at a tilt angle less than the first angle θ1, the semiconductor substrate 701 between the gate patterns PG and B1 formed in the first peripheral region P1 is blocked by the gate patterns PG and B1 formed in the first peripheral region P1. Consequently, the second dopant does not have an effect on the first peripheral junction regions 701a formed in the first peripheral region P1 because it is not implanted into the first peripheral region P1. Thus, the second dopant does not influence the first peripheral junction regions 701a (i.e., the junction regions of the PMOS transistor).

The second dopant implanted into the second peripheral region P2 by the second ion implantation process diffuses under the second barrier dummy patterns B2 by an additional thermal process or heat generated when a subsequent process is performed. That is, the first dopant diffused under the second barrier dummy patterns B2 is offset by the diffusion of the second dopant, so the first peripheral junction regions (refer to 701a of FIG. 7B) under the second barrier dummy patterns B2 are removed.

Figure 7D:
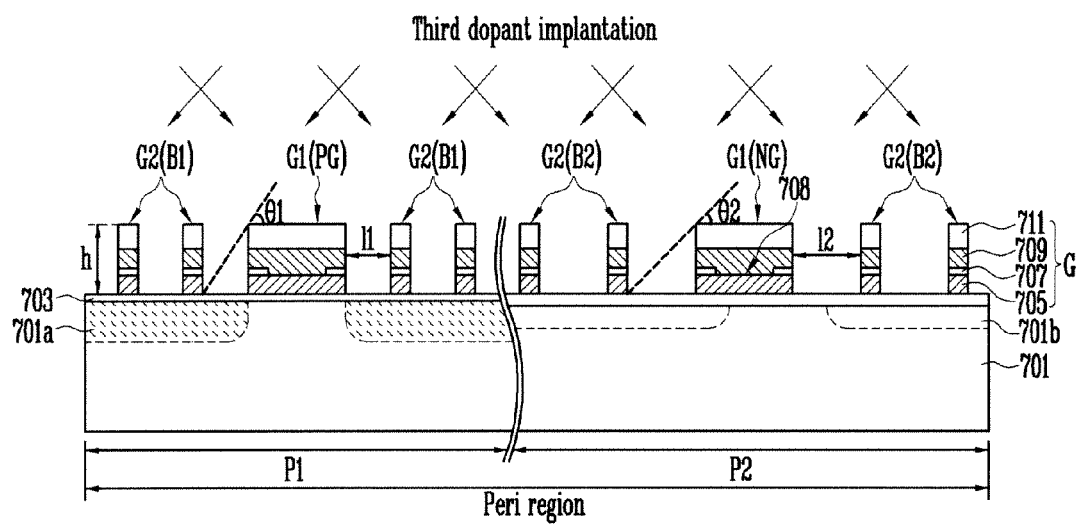
Figure 8D:
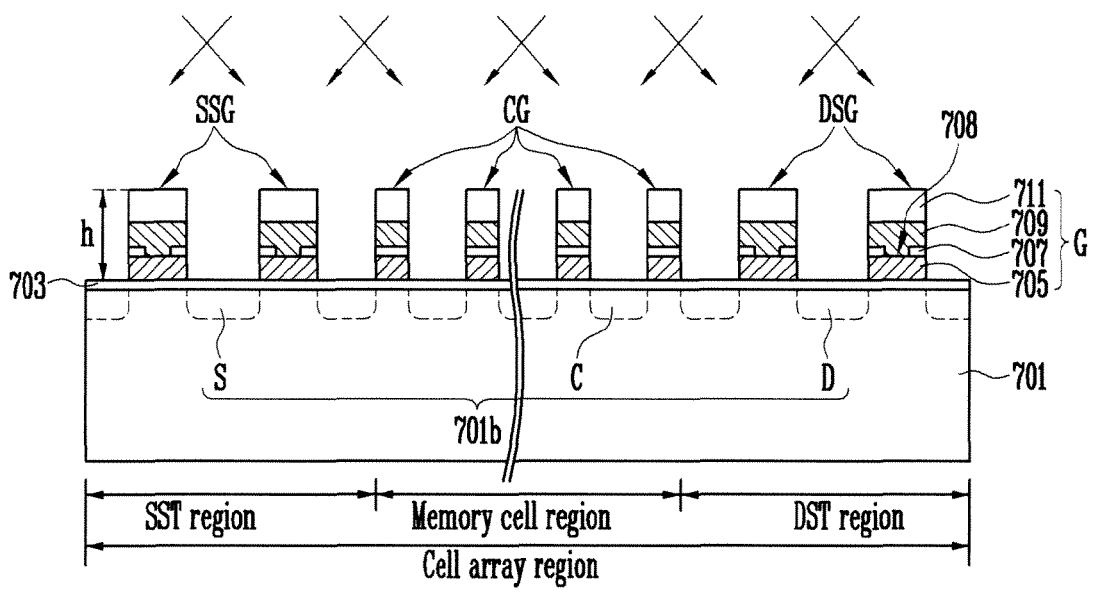

Referring to FIGS. 7D and 8D, to block the implantation of a third dopant into the first peripheral region P1 and to use the cell array region as a target, the third ion implantation process of implanting the third dopant at a tilt angle of more than the third angle θ3 to less than the first angle θ1 is performed. Junction regions 701b are formed in the cell array region through the third ion implantation process. When performing the third ion implantation process at a tilt angle, the third dopant is implanted into the semiconductor substrate 701 at symmetrical angles so that the junction regions 701b (i.e., an N-type) are uniformly formed on both sides of each of the SSG, the DSG, and the CG.

The junction regions 701b formed in the cell array region include a source region S between the SSGs, a drain region D between the DSGs, and cell junction regions C between the CGs, between the SSG and the CG, and between the DSG and the CG.

The third dopant preferably is an N-type impurity, such as phosphorus (P) or arsenic (As).

The third dopant is implanted into the semiconductor substrate 701 at a tilt angle of more than the third angle θ3 to less than the first angle θ1 in the same manner as the second dopant that is described above with reference to FIGS. 7C and 8C. Thus, the semiconductor substrate 701 between the gate patterns PG and B1 formed in the first peripheral region P1 is blocked by the gate patterns PG and B1 formed in the first peripheral region P1. Consequently, the third dopant does not have an effect on the first peripheral junction regions 701a formed in the first peripheral region P1 because it is not implanted into the first peripheral region P1. That is, the third dopant does not influence the first peripheral junction regions 701a (i.e., the junction regions of the PMOS transistor).

Meanwhile, the third dopant is also implanted between the gate patterns NG and B2 formed in the second peripheral region P2 because it is implanted at the third angle θ3 greater than the second angle θ2. Thus, the junction regions 701b can also be formed in the second peripheral region P2. Furthermore, the third dopant implanted into the second peripheral region P2 by the third ion implantation process can diffuse under the second barrier dummy patterns B2 by an additional thermal process or heat generated when a subsequent process is performed. That is, the junction regions 701b formed in the second peripheral region P2 may be interconnected under the second barrier dummy patterns B2 by the diffusion of the third dopant. However, although the third dopant diffuses, the junction regions 701b of the cell array region are formed on both sides of the CG, both sides of the DSG, and both sides of the SSG so that they are spaced from each other with the channel region under the CG, the channel region under the DSG, and the channel region under the SSG interposed therebetween, respectively. As described above, the junction regions 701b of the cell array region can be formed on both sides of each of the CG, the DSG, and the SSG because the second barrier dummy pattern B2 has a width narrower than that of each of the CG, the DSG, and the SSG.

Figure 7E:
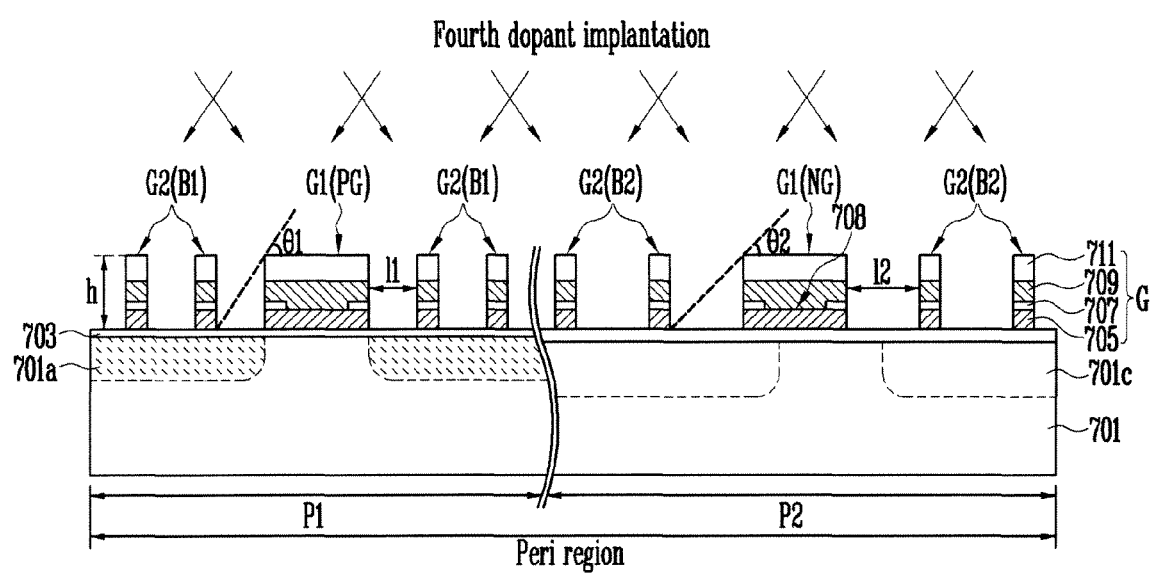

Referring to FIGS. 7E and 8D, to block a fourth dopant from being implanted into the first peripheral region P1 and the cell array region and to use the second peripheral region P2 as a target, the fourth ion implantation process of implanting the fourth dopant at a tilt angle of more than the second angle θ2 to less than the fourth angle θ4 is performed. Thus, second peripheral junction regions 701c (i.e., an N-type) are formed in the second peripheral region P2. When performing the fourth ion implantation process at a tilt angle, the fourth dopant is implanted into the semiconductor substrate 701 at symmetrical angles so that the second peripheral junction regions 701c are uniformly formed on both sides of the second driving gate NG.

The fourth dopant is implanted at a tilt angle of more than the fourth angle θ4 to less than the second angle θ2. Thus, the semiconductor substrate 701 between the gate patterns PG and B1 formed in the first peripheral region P1 is blocked by the gate patterns PG and B1 formed in the first peripheral region P1. Further, the semiconductor substrate 701 of the cell array region is blocked by the CGs, the SSGs, and the DSGs. Consequently, the fourth dopant does not have an effect on the first peripheral junction regions 701a formed in the first peripheral region P1 and the junction regions 701b formed in the cell array region because the fourth dopant is not implanted into the first peripheral region P1 and the cell array region.

The fourth dopant implanted into the second peripheral region P2 by the fourth ion implantation process diffuses under the second barrier dummy patterns B2 by an additional thermal process or heat generated when a subsequent process is performed. That is, the second peripheral junction regions 701c are interconnected under the second barrier dummy patterns B2 by the diffusion of the fourth dopant. On the other hand, the second peripheral junction regions 701c formed by the diffusion of the fourth dopant preferably are formed on both sides of the second driving gate NG so that they are spaced from each other with the channel region under the second driving gate NG interposed therebetween. The reason why, as described above, the second peripheral junction regions 701c can be spaced from each other under the second driving gate NG and can be interconnected under the second barrier dummy patterns B2 is that the second barrier dummy pattern B2 has a width narrower than that of the second driving gate NG.

The fourth dopant is used to form the source and the drain of an NMOS transistor and preferably is an N-type impurity, such as phosphorus (P) or arsenic (As). The fourth dopant preferably includes the same material as the third dopant. Thus, in the process of forming the junction regions 701b in the cell array region before forming the second peripheral junction regions 701c, the third dopant including the same material as the fourth dopant is previously implanted into portions where the second peripheral junction regions 701c will be formed. Accordingly, it is preferred that the second peripheral junction regions 701c be formed by implanting the fourth dopant at a low dose and with low ion implantation energy as compared with the dose and the ion implantation energy which are necessary to form the second peripheral junction regions 701c in the state in which the third dopant has not been implanted.

Moreover, before forming the second peripheral junction regions 701c after the junction regions 701b are formed in the cell array region, a fifth dopant for offsetting the third dopant implanted into the second peripheral region P2 may be implanted at a tilt angle of more than the fourth angle θ4 to less than the second angle θ2. When considering that the third dopant is an N-type impurity ion, it is preferred that the fifth dopant is a P-type impurity ion, such as boron (B). The fifth dopant can be implanted at the same depth and the same dose as the third dopant to remove the junction regions (refer to 701b of FIG. 7D) formed in the second peripheral region P2. The fifth dopant implanted into the second peripheral region P2 diffuses under the second barrier dummy patterns B2 by an additional thermal process or heat generated when a subsequent process is performed. That is, the first dopant diffused under the second barrier dummy patterns B2 is offset by the diffusion of the second dopant, thereby removing the junction regions (refer to 701b of FIG. 7D) under the second barrier dummy patterns B2.

As described above, in the one or more embodiments, the first patterns (i.e., the driving gates) and the second patterns (i.e., the barrier dummy patterns) are formed in the peripheral region, the distance between the patterns formed in the peripheral region differs from the distance between the patterns formed in the cell array region, and the distance between the patterns formed in the peripheral region also differs for every element. Accordingly, according to the one or more embodiments, a variety of the junction regions which are composed of different kinds of ions or are distributed at a different concentration or at different depths can be formed without using an additional mask, such as a photoresist pattern. As described above, since the mask process can be obviated, the process of forming the junction regions of a nonvolatile memory device can be simplified.

FIGS. 9A to 9E are sectional views illustrating a method of forming the junction regions of a nonvolatile memory device according to a fifth embodiment.

Figure 9A:
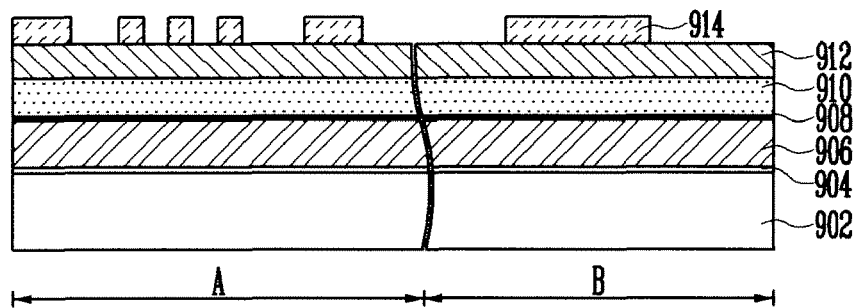
FIGS. 9A to 9E are sectional views illustrating a method of forming the junction regions of a nonvolatile memory device according to a fifth embodiment.

Referring to FIG. 9A, there is provided a semiconductor substrate 902 including a cell region A and a peripheral region B. Gates formed in the peripheral region B have a pitch greater than the pitch of gates formed in the cell region A.

A screen oxide layer (not shown) is formed over the semiconductor substrate 902. A well ion implantation process or a threshold voltage ion implantation process is performed on the semiconductor substrate 902. The well ion implantation process is performed to form well regions in the semiconductor substrate 902, and the threshold voltage ion implantation process is performed to control the threshold voltage of a nonvolatile memory device, such as a transistor. Further, the screen oxide layer (not shown) prevents the surface of the semiconductor substrate 902 from being damaged when the well ion implantation process or the threshold voltage ion implantation process is performed. Accordingly, the well regions (not shown) are formed in the semiconductor substrate 902.

After the screen oxide layer (not shown) is removed, a gate insulation layer 904 is formed over the semiconductor substrate 902. The gate insulation layer 904 can transmit electrons through Fowler/Nordheim (F/N) tunneling. The gate insulation layer 904 preferably is formed of an oxide layer.

A first conductive layer 906 for floating gates is formed on the gate insulation layer 904. The first conductive layer 906 can store or discharge electric charges. Thus, when a program operation is performed, the electrons of channel regions of the semiconductor substrate 902 can pass through the gate insulation layer 904 and can be stored in the first conductive layer 906. When an erase operation is performed, electric charges stored in the first conductive layer 906 can pass through the gate insulation layer 904 and can be discharged toward the semiconductor substrate 902. The first conductive layer 906 is formed of a polysilicon layer.

Although not shown in the drawing, the first conductive layer 906 and the gate insulation layer 904 formed over the isolation regions of the semiconductor substrate 902 are etched and the semiconductor substrate 902 of the isolation regions are etched, thereby forming trenches (not shown) in the semiconductor substrate 902. The trenches (not shown) are gap-filled with an insulating material, thereby forming isolation layers (not shown) defining active regions.

A dielectric layer 908 is formed on the first conductive layer 906 including the isolation layers (not shown). The dielectric layer 908 insulates floating gates formed on the lower part of the dielectric layer 908 and control gates formed on the upper part of the dielectric layer 908. The dielectric layer 908 may have an oxide/nitride/oxide (ONO) structure having a stack structure of an oxide layer, a nitride layer, and an oxide layer.

Part of the dielectric layer 908 of regions where drain select lines or source select lines are formed is removed. The reason why part of the dielectric layer 908 is removed is to form gates in the drain select lines or the source select lines by coupling conductive layers on the upper and lower parts of the dielectric layer.

A second conductive layer 910 for control gates is formed on the dielectric layer 908. The second conductive layer 910 preferably is formed of a polysilicon layer. A gate electrode layer 912 is formed on the second conductive layer 910. The gate electrode layer 912 functions to reduce the resistance of a control gate which gradually has a narrow width according to a reduction in the size of a nonvolatile memory device. The gate electrode layer 912 is made of a metallic material (e.g., tungsten silicide (WSi$_x$)) which has a lower resistance than the second conductive layer 910. A hard mask layer pattern 914 which is used to pattern gates is formed on the gate electrode layer 912.

Figure 9B:
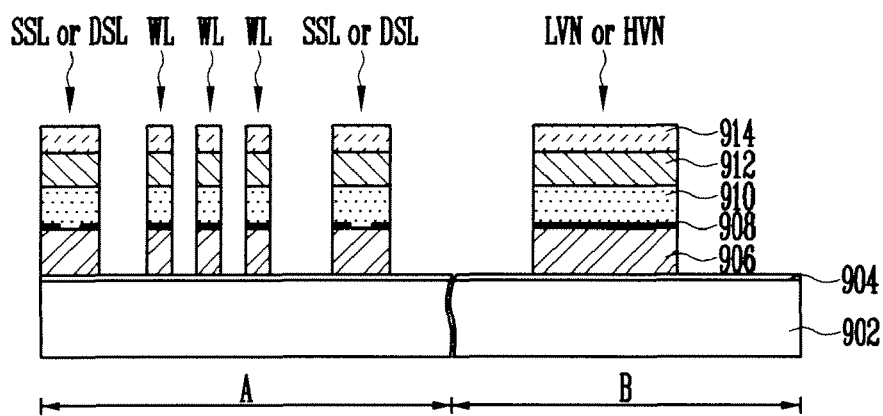

Referring to FIG. 9B, the hard mask layer 914 is etched and patterned by an etch process using the hard mask layer pattern 914. The gate electrode layer 912, the second conductive layer 910, the dielectric layer 908, and the first conductive layer 906 are etched by an etch process using the patterned hard mask layer 116.

Accordingly, word lines WL (i.e., first gates) and select lines (i.e., second gates), including source select lines SSL and drain select lines DSL, are formed in a cell region A. A number of the word lines WL0 to WL31 are formed between the source select line SSL and the drain select line DSL.

Meanwhile, gates of low-voltage NMOS transistors LVN or high-voltage NMOS transistors HVN (i.e., third gates) are formed in a peripheral region B.

Figure 9C:
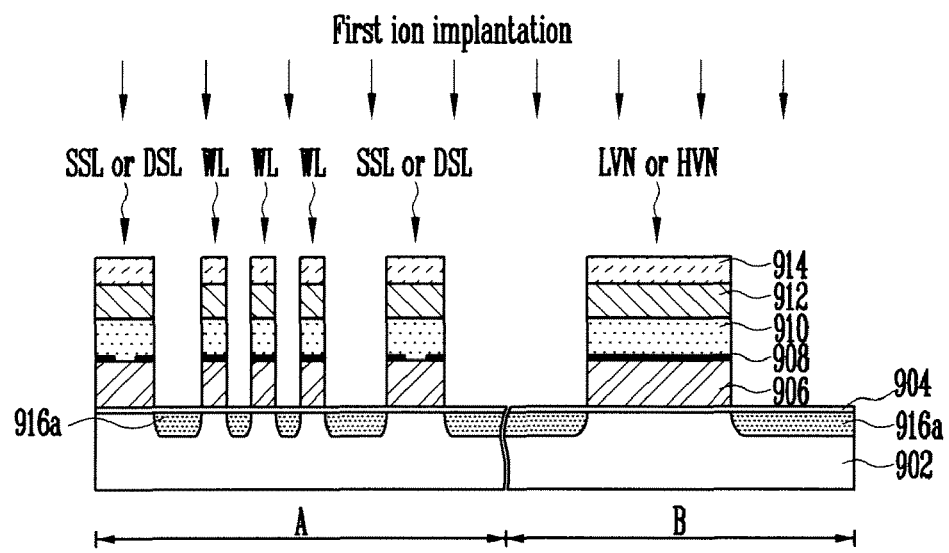

Referring to FIG. 9C, first junction regions 916a are formed on a surface of the semiconductor substrate 902 on both sides of each of the gates. The first junction regions 916a may be formed by performing a first ion implantation process on the surface of the semiconductor substrate 902 which is exposed between the gates in the cell region A and the peripheral region B without a mask.

Figure 9D:
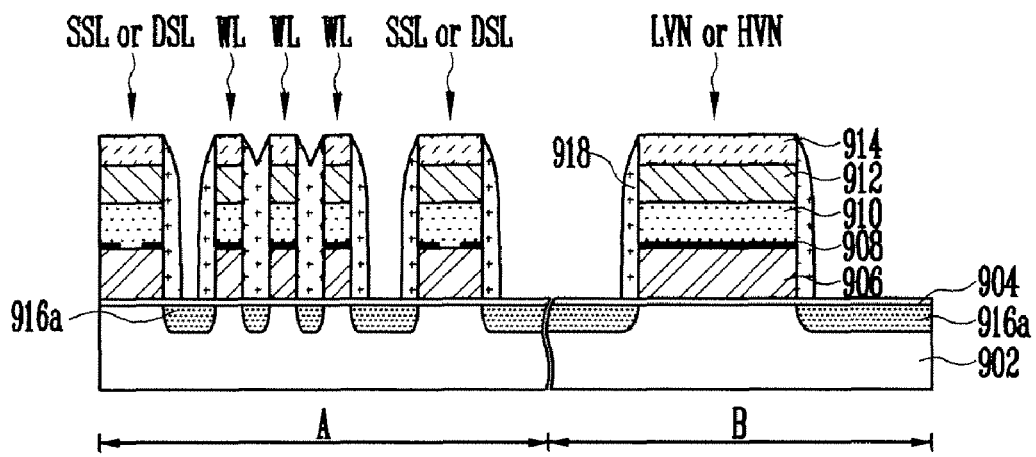

Referring to FIG. 9D, an insulating layer is formed on the semiconductor substrate 902 including the gates. The insulating layer preferably includes an oxide layer or a nitride layer. Passivation layers 918 are formed on the sidewalls of the gates, preferably by performing an anisotropic etch process on the insulating layer. The passivation layers 918 are formed to prevent impurity ions from being implanted under the passivation layers 918 when a subsequent ion implantation process is performed and to selectively perform an impurity ion implantation process on only regions where the passivation layers 918 are opened.

Here, since each of first regions between the word lines WL has a very narrow width, the insulating layer remains in the spaces between the word lines WL without being removed, and so the spaces are gap-filled with the passivation layers 918. On the other hand, since second regions between the select line SSL or DSL and a word line WL adjacent to the select line SSL or DSL or a third region between the low-voltage NMOS transistors LVN or the high-voltage NMOS transistors HVN has a width wider than that of the first region, the insulating layer in the second regions and the third region is etched, so a surface of the semiconductor substrate 102 is exposed between the passivation layers 918. In this case, the width of the semiconductor substrate 902 that is exposed in the third region is much wide because the width of the third region is much wider than that of the second region.

Figure 9E:
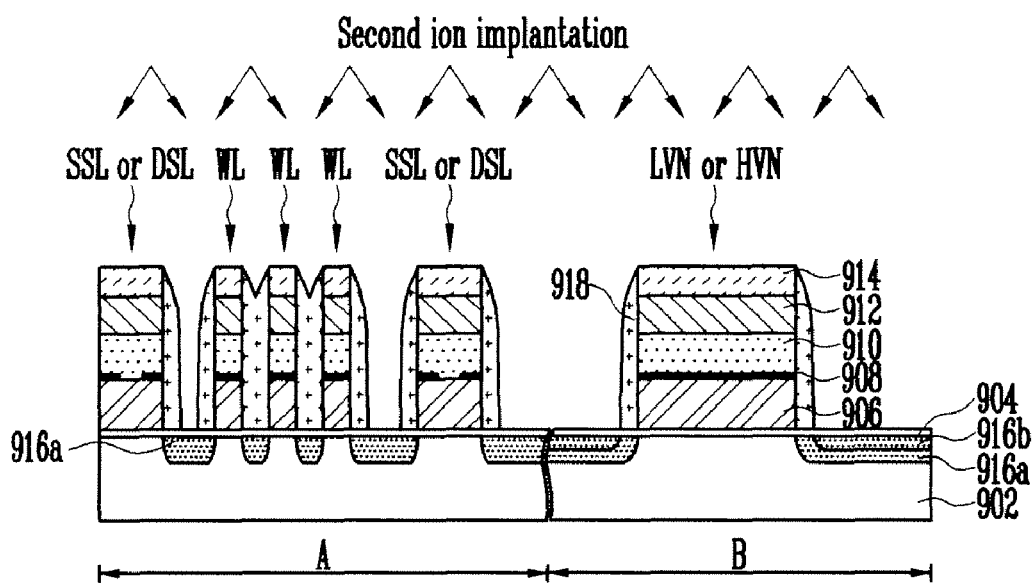

Referring to FIG. 9E, second junction regions 916b are formed on the first junction regions 916a, respectively, on both sides of each of the low-voltage NMOS transistors LVN or the high-voltage NMOS transistors HVN of the peripheral region B. The second junction regions 916b have a different concentration from that of the first junction regions 916a. The second junction regions 916b are formed by performing a second ion implantation process on the semiconductor substrate 902 using a tilt ion implantation method having a tilt angle. The dose of impurities used in the second ion implantation process preferably is greater than the dose of impurities used in the first ion implantation process.

In this case, since the first regions between the word lines WL are gap-filled with the passivation layers 918, impurity ions are not further implanted into the semiconductor substrate 902 of the first regions. Furthermore, in the second regions between the select line SSL or DSL and the word line WL adjacent to the select line SSL or DSL, the semiconductor substrate 902 is exposed between the passivation layers 918. However, since the width of the second region is smaller than the height of the select line SSL or DSL and the word line WL, impurities do not reach up to the semiconductor substrate 902 exposed between the passivation layers 918 when the impurities are implanted using a tilt ion implantation method. Accordingly, no further impurity ion implantation process is performed on the semiconductor substrate 902 which is exposed in the second regions between the select line SSL or DSL and the word line WL adjacent to the select line SSL or DSL.

On the other hand, in the third region between the low-voltage NMOS transistors LVN or the high-voltage NMOS transistors HVN of the peripheral region B, the width of the semiconductor substrate 902 exposed between the passivation layers 918 is wider than that of the second region. Thus, although a tilt ion implantation method is used, impurity ions can sufficiently reach the surface of the semiconductor substrate 902 exposed in the third region.

Accordingly, the junction regions, each having a double doped drain (DDD) including the first junction region 116a and the second junction region 916b with a different impurity concentration, are formed on both sides of the low-voltage NMOS transistor LVN or the high-voltage NMOS transistor HVN of the peripheral region B.

The junction regions of the low-voltage NMOS transistor LVN or the high-voltage NMOS transistor HVN which are formed in the peripheral region B typically have a lightly-doped drain (LDD) or a DDD, unlike other junction regions. To this end, an ion implantation mask for opening only junction regions adjacent to the low-voltage NMOS transistor LVN or the high-voltage NMOS transistor HVN has to be further formed.

However, in the one or more embodiments, the gates formed in each region of the semiconductor substrate 902 have a different pitch as described above. Thus, although only the anisotropic etch process is performed after the insulating layer is formed on the semiconductor substrate 902 including the gates, only the junction regions adjacent to the low-voltage NMOS transistor LVN or the high-voltage NMOS transistor of the peripheral region B can be opened. Furthermore, since an impurity implantation process for forming the junction regions of the peripheral region B is performed using the tilt ion implantation method, impurity ions are not implanted into the regions between the select line SSL or DSL and a word line WL adjacent to the select line SSL or DSL which are partially opened in the cell region A.

Meanwhile, the passivation layers 118 may be removed after performing the second ion implantation process, but may remain for use as spacers of the gates in subsequent processes.

In one or more of the foregoing embodiments of this disclosure, the process of forming the junction regions adjacent to the low-voltage NMOS transistor LVN or the high-voltage NMOS transistor of the peripheral region B using a different concentration is described as an example. However, the present disclosure is not limited to the above embodiments, but may be applied to all ion implantation processes in which an additional ion implantation process has to be performed on junction regions adjacent to gates having a wide pitch, which belong to gates formed over a semiconductor substrate.

The present disclosure may have the following advantages.

First, the occurrence of the leakage current in junction regions can be prevented because, in a process of forming the junction regions, an ion implantation process using impurities having a tilted incident angle is further performed on regions having a wide distance.

In particular, capacitance of junction regions formed between the word lines and the select lines can be reduced while not influencing the junction regions between the word lines, and electrons can be prevented from being trapped in the gate insulation layer. Accordingly, the cycling characteristic of a word line adjacent to the select line can be prevented.

Second, the barrier dummy patterns as well as the driving gates are formed in the peripheral region. Accordingly, a variety of junction regions which are composed of different kinds of ions or are distributed at a different concentration or at different depths can be formed without using an additional mask, such as a photoresist pattern.

As described above, since the mask process can be obviated, a process of forming the junction regions of a nonvolatile memory device can be simplified. Accordingly, the manufacturing time and the manufacturing cost of nonvolatile memory devices can be reduced.

Third, although an additional ion implantation mask is not formed, an ion implantation mask that selectively opens a semiconductor substrate adjacent to gates having a great pitch can be formed only through the formation of the insulating layer and the use of the anisotropic etch process. Accordingly, the turn-around time and the process expenses can be reduced. Furthermore, process steps can be further reduced because the passivation layers formed in the gates may remain in subsequent processes to use them as spacers.

What is claimed is:

1. A method of manufacturing a nonvolatile memory device, comprising:
    providing a semiconductor substrate including a cell region;
    forming first gate lines and second gate lines over the cell region of the semiconductor substrate, wherein the first gate lines are spaced from each other at a first width, the second gate lines are spaced from each other at a second width, and the first gate lines and the second gate lines are spaced from each other at a third width;
    forming first junction regions in the semiconductor substrate between the first gate lines, between the first gate line and an adjacent second gate line, and between the second gate lines by performing a first ion implantation process; and
    forming second junction regions in first junction region of the semiconductor substrate between the first gate lines and between a second gate line and an adjacent first gate line by performing a second ion implantation process,
    wherein the third width is wider than the second width, and wherein the third width is larger than a height of the first gate lines and the second gate lines.

2. The method of claim 1, wherein the second ion implantation process is a tilt ion implantation process.

3. The method of claim 2, wherein the second ion implantation process is not performed in the first junction regions formed between the second gate lines.

4. The method of claim 1, wherein the first ion implantation process is performed by implanting impurities in a direction vertical to the semiconductor substrate.

5. The method of claim 1, wherein an impurity concentration of the second ion implantation process is lower than an impurity concentration of the first ion implantation process.

6. The method of claim 1, wherein the second ion implantation process comprises:
    forming a mask pattern exposing the first junction regions formed between the first gate lines and between the second gate line and the first gate line; and
    performing the second ion implantation process to form the second junction regions in the exposed first junction regions using the mask pattern as an ion implantation mask.

7. The method of claim 1, wherein the second ion implantation process comprises:
    forming spacers on sidewalls of the first gate lines and on a sidewall of the second gate line formed adjacent to the first gate lines with covering the first junction regions formed between the second gate lines; and
    performing the second implantation process to form the second junction regions between the first gate lines and between the second gate line and the first gate line using the spacers as an ion implantation mask.

8. The method of claim 1, wherein the first gate lines comprise select lines and the second gate lines comprise word lines.

9. The method of claim 1, wherein the first width is wider than that of the second width.

10. The method of claim 7, wherein the spacer comprises an oxide layer or nitride layer.

11. A method of manufacturing a nonvolatile memory device, comprising;
    providing a semiconductor substrate including a cell region and a peripheral region;
    forming select transistors and a plurality of memory cells over the semiconductor substrate of the cell region, and forming low-voltage NMOS transistors or high-voltage NMOS transistors over the semiconductor substrate of the peripheral region, wherein a memory cell and an adjacent select transistor are spaced from each other at a first width, and the low-voltage NMOS transistors or high-voltage NMOS transistors are spaced from each other at a second width, and wherein the first width is smaller than a height of the select transistors and the memory cells;
    forming first junction regions in the semiconductor substrate between the select transistors, between the memory cell and the adjacent select transistor, between the plurality of the memory cells, and between the low-voltage NMOS transistors or the high-voltage NMOS transistors;
    forming spacers on sidewalls of the select transistors, the memory cells, and the low-voltage NMOS transistors or the high-voltage NMOS transistors, wherein the spacers formed on the sidewalls of the memory cells cover the first junction regions formed between the memory cells; and,
    forming second junction regions in the first junction regions of the semiconductor substrate between the low-voltage NMOS transistors or the high-voltage NMOS transistors by performing a tilt ion implantation process using the spacers as an ion implantation mask.

12. The method of claim 11, wherein the first width is narrower than the second width.

13. The method of claim 11, wherein the spacer comprises oxide layer or nitride layer.

* * * * *